US006913998B2

(12) United States Patent
Jankowski et al.

(10) Patent No.: US 6,913,998 B2
(45) Date of Patent: Jul. 5, 2005

(54) VAPOR-DEPOSITED POROUS FILMS FOR ENERGY CONVERSION

(75) Inventors: Alan F. Jankowski, Livermore, CA (US); Jeffrey P. Hayes, Tracy, CA (US); Jeffrey D. Morse, Martinez, CA (US)

(73) Assignee: The Regents of the University of California, Oakland, CA (US)

( * ) Notice: Subject to any disclaimer, the term of this patent is extended or adjusted under 35 U.S.C. 154(b) by 78 days.

(21) Appl. No.: 10/612,177

(22) Filed: Jul. 1, 2003

(65) Prior Publication Data

US 2005/0016832 A1 Jan. 27, 2005

Related U.S. Application Data

(60) Provisional application No. 60/393,343, filed on Jul. 1, 2002.
(51) Int. Cl.$^7$ ............................................... H01L 21/44
(52) U.S. Cl. ...................... 438/666; 438/674; 438/678; 438/679
(58) Field of Search ................................ 438/584, 666, 438/674, 678, 679

(56) References Cited

U.S. PATENT DOCUMENTS

| | | | | |
|---|---|---|---|---|
| 5,204,191 A | * | 4/1993 | Dubois et al. | 428/650 |
| 6,365,236 B1 | * | 4/2002 | Maloney | 427/585 |
| 6,541,676 B1 | | 4/2003 | Franz et al. | |
| 6,569,553 B1 | | 5/2003 | Koripella et al. | |
| 2002/0081468 A1 | | 6/2002 | Shioya | |
| 2002/0094462 A1 | | 7/2002 | Shioya et al. | |
| 2002/0106540 A1 | | 8/2002 | Shioya | |
| 2003/0190508 A1 | | 10/2003 | Takeyama et al. | |

OTHER PUBLICATIONS

Aleks J. Franz et al, High Temperature Gas Phase Catalytic and Membrane Reactors.
Francis Jones et al, Experimental System for the Study of Gas–Solid Heterogeneous Catalysis in Microreactors, Microfluidic Devices and Systems III Proceedings of SPIE vol. 4177 pp. 124–131.
Tamara M. Floyd et al, Liquid–Phase and Multi–Phase Microreactors for Chemical Synthesis.
Ravi Srinivasan et al, Micromachined Reactors for Catalytic partial Oxidation Reactions, AIChE Journal Nov. 1997 vol. 43 No. 11 pp. 3059–3068.
T. Tsai et al, Sputter deposition of cermet fuel electrodes for solid oxide fuel cells, J. Vac. Sci, Technol. A 13 (3) May/Jun. 1995.

* cited by examiner

*Primary Examiner*—Ngân V. Ngô
(74) *Attorney, Agent, or Firm*—James S. Tak; Alan H. Thompson; Eddie E. Scott

(57) ABSTRACT

Metallic films are grown with a "spongelike" morphology in the as-deposited condition using planar magnetron sputtering. The morphology of the deposit is characterized by metallic continuity in three dimensions with continuous and open porosity on the submicron scale. The stabilization of the spongelike morphology is found over a limited range of the sputter deposition parameters, that is, of working gas pressure and substrate temperature. This spongelike morphology is an extension of the features as generally represented in the classic zone models of growth for physical vapor deposits. Nickel coatings were deposited with working gas pressures up 4 Pa and for substrate temperatures up to 1000 K. The morphology of the deposits is examined in plan and in cross section views with scanning electron microscopy (SEM). The parametric range of gas pressure and substrate temperature (relative to absolute melt point) under which the spongelike metal deposits are produced appear universal for other metals including gold, silver, and aluminum.

1 Claim, 3 Drawing Sheets

VAPOR-DEPOSITED POROUS FILMS FOR ENERGY CONVERSION

The present invention relates to and claims priority under 35 USC 120 to Provisional Application No. 60/393,343 filed Jul. 1, 2002 which are hereby incorporated by reference in there entirety.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The use of porous films is prevalent in many advanced electrochemical systems for energy conversion. For example, in both polymer exchange membrane fuel cells (PEMFCs) and solid-oxide fuel cells (SOFCs), porous films can be used to reform hydrocarbon fuels to liberate hydrogen gas and/or to serve as the conductive electrodes to transport current. Since miniaturized fuel cells are of interest for applications in portable power generation, the processing of film components at both low and high temperature becomes evermore significant for enhanced performance. In addition, methods for film processing integral components should be compatible with the device thermal history to ease manufacturing.

Porous and conductive films are used as integral components in many types of electric power generating devices and sensors. A wide range of commercial products exist in consumer electronics, e.g., cell phones and laptop computers. Methods to produce conductive and porous films are in general limited by the size of the pore obtained. In addition, complex synthesis methods involving gaseous and/or aqueous processes often generate toxic byproducts and wastes. For example, an advance in the pursuit of fabricating porous conductive films near room temperature relies on photolithographic patterning and etching process steps.

The following articles, which are hereby incorporated by reference, describe general observations regarding the stabilization of basic coating morphologies found in the classic zone models. Also described are experiments of film growth. B. A. Movchan and A. V. Demchishin, Phys. Met. Metallorg., 28 (1969) 83; J. A. Thornton, J. Vac. Sci. Technol., 11 (1974) 666; J. A. Thornton, J. Vac Sci. Technol., 12 (1975) 830; J. A. Thornton, Ann. Rev. Mater. Sci., 7 (1977) 239; J. A. Thornton, J. Vac. Sci. Technol. A, 4 (1986) 3059; J. A. Thornton, SPIE Proc., 821 (1987) 95; and R. F. Bunshah and R. S. Juntz, Metall. Trans., 4 (1973) 21.

Other articles related to the art include the following and are also hereby incorporated by reference: A. F. Jankowski and J. P. Hayes, J. Vac. Sci. Technol. A, 13 (1995) 658; M. Neirynck, W. Samaey, and L. Van Poucke, J. Vac. Sci. Technol., 11 (1974) 647; D. Queheillalt, D. Haas, D. Sypec, and H. Wadley, J. Mater. Res., 16 (2001) 1028; J. Morse, R. Graff, J. Hayes, and A. Jankowski, Mater. Res. Soc. Symp. Proc., 575 (2000) 321; A. F. Jankowski and J. D. Morse, Mater. Res. Soc. Symp. Proc., 496 (1998) 155; R. Messier, A. Giri, and R. Roy, J. Vac. Sci. Technol. A, 2 (1984) 500.

SUMMARY OF THE INVENTION

An aspect of the invention includes sputter deposition method comprising: providing a substrate; sputter depositing a metal onto said substrate under temperatures ranging from 0.4 to 0.6 of the melting temperature of the metal to form a coating having a three dimensional sub-micron porosity.

BRIEF DESCRIPTION OF THE DRAWINGS

FIG. 1$b$ is an SEM of a sputter deposited coating of silver.

FIG. 1$c$ is an SEM of a sputter deposited coating of aluminum.

FIG. 3$b$ is a cross section SEM image of a sputter deposited coating of nickel at 20 mTorr and 445° C. Bar is equal to 0.5 $\mu$m.

FIG. 3$c$ is a cross section SEM image of a sputter deposited coating of nickel at 10 mTorr and 600° C. Bar is equal to 0.5 $\mu$m.

FIG. 3$d$ is a cross section SEM image of a sputter deposited coating of nickel at 10 mTorr and 810° C. Bar is equal to 0.5 $\mu$m.

DETAILED DESCRIPTION

SOFCs are typically made using components from bulk ceramic powder processing in combination with a synthesis approach of layering the ceramic-metal composite electrode with the electrolyte layer. SOFCs can be operated at temperatures as low as 400° C. or in excess of 1000° C. for high-power output performance. PEMFCs are often made as a laminate of a polymer electrolyte and typically operate below 125° C. In each application, coatings in thin or thick film form can be used for processing both the electrolyte and the electrodes. The use of vapor deposition methods such as sputtering readily accesses a wide range of target compositions to form the electrolyte and/or electrode layers that enhance cell performance.

A new method to produce metallic films with continuous porosity is described herein that uses vapor deposition processes compatible with high-yield microelectronic processing methods. This new method for processing porous films eliminates the need of post-deposition process steps as chemical etching. Porous films are formed in the as-deposited state through control of the deposition process parameters of sputter gas pressure and substrate temperature.

A fully integrated, thin film fuel cell (TFFC) device comprises cell stacks that combine a fuel and oxidant gas to generate electric current. Each individual fuel cell level is based on an anode and cathode separated by an electrolyte layer. Thin film SOFCs and PEMFCs can be made using standard photolithographic patterning and etching combined with physical vapor deposition. A substrate (as silicon) suitable for anisotropic etching and a removable protective nitride layer provide the platform for the anode-electrolyte-cathode layer stack. For example, one embodiment of an SOFC comprises a nickel anode, a yttria-stabilized zirconia electrolyte and a silver cathode all as thin as 1 $\mu$m, if synthesized using sputter deposition.

Porous electrodes are desirable because the electrode layers enable the reactive gases to combine as well as transport the electric current. The fuel cell output is enhanced through maximizing the contact area between the electrode and the electrolyte, thus reducing the pore size of the electrode enhances the electrical performance and the mechanical strength of the support electrode.

Figure 1A:
FIG. 1$a$ is an SEM of a sputter deposited coating of gold.
Figure 1B:
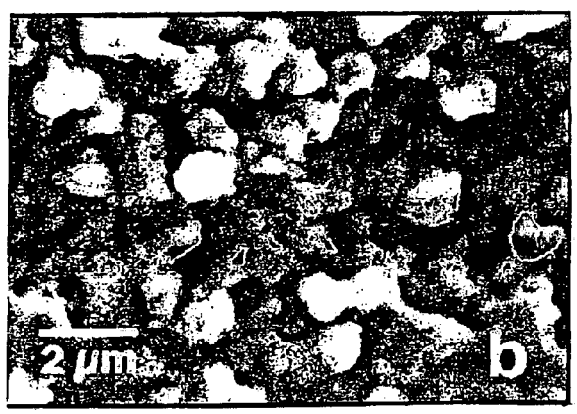
Figure 1C:
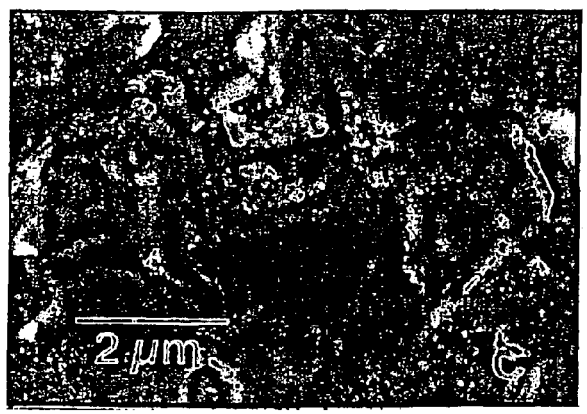

A metallic sponge can be produced by appropriately controlling the parametric conditions for the sputter deposition process. By combining a moderate sputter gas pressure (e.g., 5 to 20 millitorr of argon gas) and an elevated substrate temperature (e.g., 45% to 50% of the absolute melting point of the material), a sponge-like morphology can be produced with micron-scaled porosity. The moderate sputter gas pressure creates a range of incident angles for deposition of the film as opposed to a line-of-sight process and the elevated temperature promotes a faceted crystalline growth in the film (two dimensional columnar structure) as opposed to a single texture. The combination of elevated substrate temperature and moderate gas pressure is the three-dimensional structures seen in FIGS. 1a, 1b, and 1c. FIG. 1a is an SEM photograph (plan view image) of the sponge-like morphology of sputter deposited coatings of gold. FIG. 1b is an SEM photograph (plan view image) of the sponge-like morphology of sputter deposited coatings of silver. FIG. 1c is an SEM photograph (plan view image) of the sponge-like morphology of sputter deposited coatings of aluminum.

The transition in morphology through four zones of growth with increasing substrate temperature and gas pressure is described for metal coatings sputter deposited using cylindrical magnetrons in J. A. Thornton, J. Vac. Sci. Technol., 11 (1974) 666 and J. A. Thornton, J. Vac Sci. Technol., 12 (1975) 830. Zone 1 is characterized by a structure comprising tapered crystallites separated by voids. A transition zone T is characterized by a structure comprising densely packed fibrous grains and a smooth surface. Zone 2 features columns that are continuous from the substrate to a surface characterized by crystalline facets. Finally, zone 3 represents the recrystallized grain structure. The primary effect of increased temperature is an enhancement of adatom surface diffusion and minimal adsorbed working gas. A three-dimensional "sponge-like" structure is defined herein as a polycrystal with continuous open porosity but without the definitive columnar features characteristic of vapor deposits.

Herein conditions for deposition are disclosed that produce the spongelike morphology extending the structural zone model for the growth of thin films and thick coatings. For sputter deposition using planar magnetrons, the general conditions are an increased working gas pressure and a substrate temperature approximately half the absolute melting point. Examples of the "sponge-like" morphology in as-deposited coatings are seen in FIGS. 1a, b, and c for gold, silver, and aluminum, respectively. The stabilization of the "sponge-like" morphology in metals is described within the context of the zone model for growth of vapor deposited coatings. Details are presented for planar-magnetron sputter deposits of nickel that are up to 10 $\mu$m in thickness.

Figure 2:
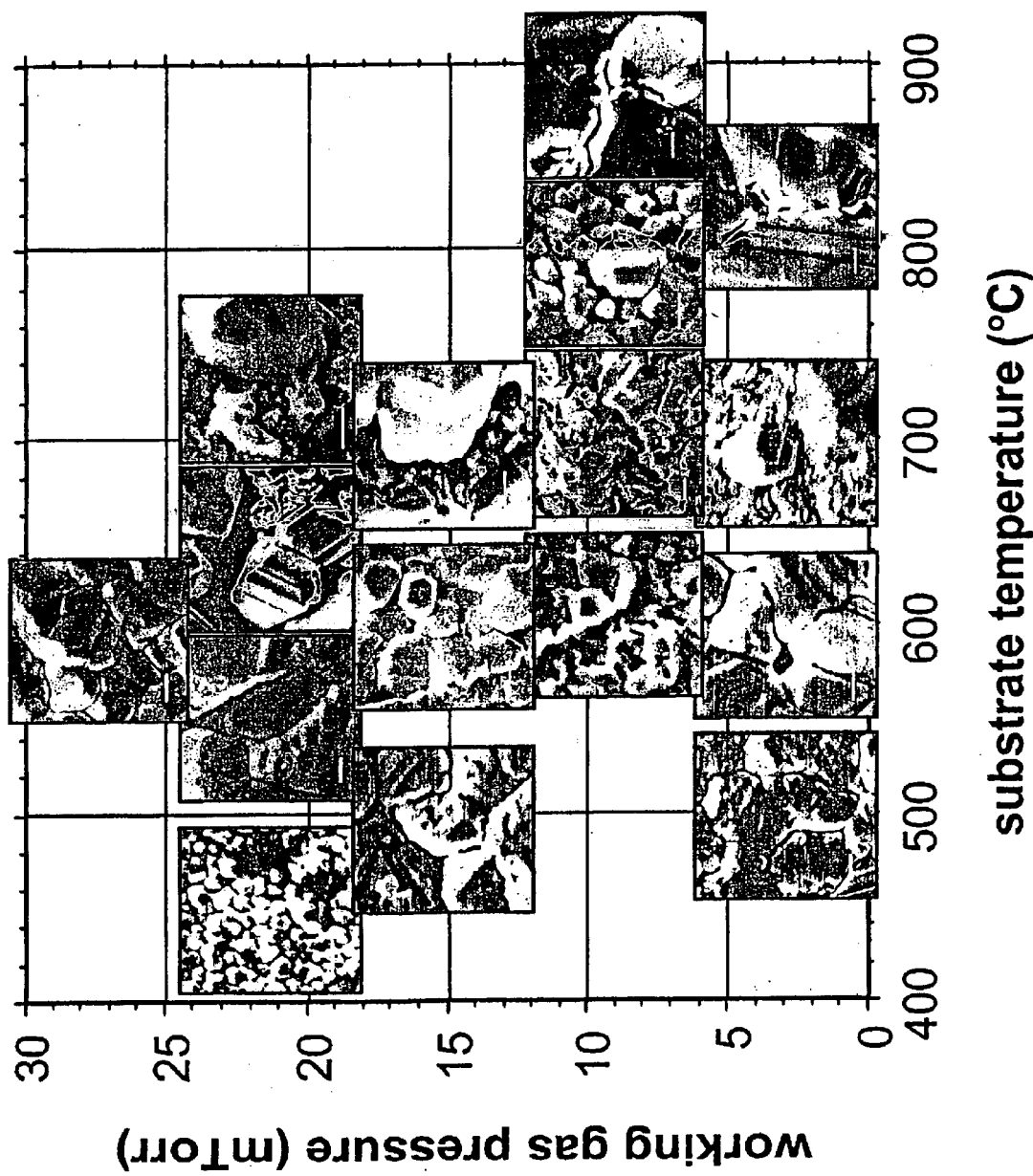
FIG. 2 shows SEM images of nickel coatings deposited as a function of working gas pressure (mTorr) and substrate temperature (° C.). Bar is equal to 0.5 $\mu$m.

In general, the results obtained for nickel with a melt temperature ($T_{melt}$) of 1455° C. are consistent with the zone model for growth of sputter deposited coatings. For example, a nickel coating deposited at 10 mTorr-220° C. is characteristic of the upper bound to Zone 1, where an increase in packing density is seen for the tapered crystallites. Results for nickel samples deposited over a working gas pressure range of 5 to 25 mTorr and substrate temperatures of 400 to 900° C. are shown in the plan view images of FIG. 2. As the substrate temperature is increased above 300° C., a transition in structure to Zone T is seen, e.g., at 20 mTorr-445° C. Faceting of the surface for a fully columnar structure becomes prevalent above 500° C. with the higher gas pressures, e.g., as seen at 25 mTorr-600° C., indicating a transition to Zone 2. A recrystallized structure appears at the highest temperatures, e.g., 5 mTorr-800° C., for Zone 3. A new morphology, i.e., "sponge-like", is seen in FIG. 2 corresponding to deposition conditions (e.g., at 10 mTorr-650° C.) that are between the Zone T and Zone 2 structures.

Figure 3B:
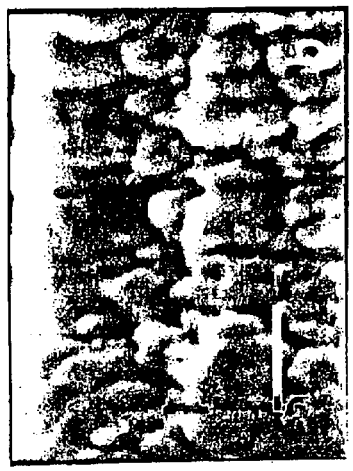
FIG. 3$a$ is a cross section SEM image of a sputter deposited coating of nickel at 10 mTorr and 220° C. Bar is equal to 0.5 $\mu$m.
Figure 3D:
Figure 3A:

The stabilization of the "sponge-like" morphology is observed as a transition between Zone T and Zone 2. The transition in structure between the characteristic zones of growth with the increase of substrate temperature is seen in the cross-section images of nickel coatings deposited at (FIG. 3a) 10 mTorr-220° C.; (FIG. 3b) 20 mTorr-445° C., (FIG. 3c) 10 mTorr-660° C., and (FIG. 3d) 10 mTorr-810° C. The cross-section images (FIGS. 3a–d) reveal the evolution from Zone 1 then Zone T through the metallic "sponge-like" morphology to Zone 3. The FIG. 3 images in cross-section provide an independent confirmation to the plan view, FIG. 2, images of the porous coating structure. The temperature range to stabilize the "sponge-like" structure for nickel appears most broad at 10 mTorr. The intermediate, working gas pressure of 10 mTorr (with respect to low pressures <5 mTorr or high pressures >20 mTorr) affects scattering of the sputtered neutrals sufficiently to enhance growth along crystalline directions other than perpendicular to the plane of the substrate. The "sponge-like" morphology is an enhancement of the porosity that can be found in high temperature deposits. The zone for "sponge-like" metal growth narrows along the pressure axis (as seen in FIG. 2) above and below 10 mTorr. By normalizing the substrate temperature to the absolute melt temperature, the zone of growth for the "sponge-like" morphology in nickel can be compared with other metals. A nominal $T_{sub} \cdot T_{melt}^{-1}$ range of 0.48–0.57 for nickel is seen in FIG. 2 for the "sponge-like" structure. The "sponge-like" structure is seen in a gold coating (FIG. 1a) deposited at 5 mTorr-300° C. (i.e., a $T_{sub} \cdot T_{melt}^{-1}$ of 0.43) and a silver coating (FIG. 1b) deposited at 15 mTorr-400° C. (i.e., a $T_{sub} \cdot T_{melt}^{-1}$ of 0.54) and a aluminum coating (FIG. 1c) deposited at 5 mTorr-200° C. (i.e., a $T_{sub} \cdot T_{melt}^{-1}$ of 0.51).

The formation of a "sponge-like" morphology in metals can be achieved through other deposition processes. For example, millimeter-sized pores can be formed using electron-beam evaporation. Metals are deposited onto an open-cell polymer foam template and then post-deposition processed to remove the polymer. Similarly, methods are available that reduce metal-polymer blends to yield, micron-size pores in thick films. For example, silver sheet is commercially available with continuous pores less than 5 $\mu$m in size. The use of process steps in addition to the deposition process is a method that produces a high density of micron-sized holes in nickel and silver films through photolithographic patterning and etching.

Figure 3C:

Whereas the lithographic approach produces a two-dimensional open porosity, e.g. similar to that of a coating with pinholes, the sputter deposition process described herein yields a coating that has a continuous (i.e. three-dimensional) sub-micron porosity in the as-deposited structure. Results of measurements using mercury porosimetry indicate values of 20 to 35 vol. % open porosity for sputter deposited coatings as shown in FIGS. 3c and 1a, respectively. In addition, weight gain measurement of the substrate after coating indicates values of 15 and 50 vol. % total (open and closed) porosity corresponding with samples imaged in FIGS. 1c and 1a, respectively. For the case of the gold coating (in FIG. 1a), the total porosity is greater than the open porosity.

The temperature range to form the "sponge-like" morphology is centered at approximately one-half the melting point ($0.5T_{melt}$) of the metal. The images that surround the "sponge-like" structure (shown in FIG. 2) confirm all of the established modes of growth as contained within the classic zone model for vapor deposits. At $0.5T_{melt}$, although recrystallization and grain growth occur in the coating, surface diffusion still dominates. The result is the onset of faceting that is prevalent for the structure of Zone 2. The enhanced surface diffusion along with recrystallization leads to the growth of grains that are not perpendicular to the substrate plane. That is, faceted planes will grow obliquely to the substrate surface and at a rate competitive with the textured normal growth. The use of a raised working gas pressure furthers scattering of the sputtered species, resulting in an increased flux at non-normal incidence to the substrate. In combination, the use of an intermediate gas pressure and an elevated substrate temperature yield the "sponge-like" morphology. It is known that working gas pressure affects the range of the Zone T by reducing the energy of sputtered species (and reflected ions) while scattering the arrival of sputtered species to more oblique angles (see J. A. Thornton, SPIE Proc., 821 (1987) 95), the superposition of Zone T with Zone 2 in forming the "sponge-like" morphology indicates a-working gas pressure effect. The location of the "sponge-like" zone is consistent with the temperature of ~$0.5T_{melt}$ (i.e., ranging from about $0.4T_{melt}$ to about $0.6T_{melt}$) that marks the transition between Zones T and 2 in the revised structure zone model which assesses conditions of energetic particle bombardment (in lieu of gas pressure).

Alternatively, the pressure effect on the mode of growth can be considered supplemental to the temperature effect in the zone model. The sputter gas scatters the sputtered neutral and reduces its energy. An increase in the working gas pressure has an equivalent effect of reducing the temperature of the deposition. Up to a point, the result is that the upper bound of a zone for a columnar growth mode will extend to higher substrate temperatures as the working gas pressure increases. However, as temperature increases sufficiently, recrystallization will dominate and the effect of increasing pressure will no longer modify the zone boundaries. This point is evident in the classic zone model of growth for vapor deposits as there is little effect of pressure on the lower bound for Zone 3. That is, the lower bound for the equiaxed deposit occurs at ~$0.8T_{melt}$ and is essentially constant at all working gas pressures. The deposition conditions used to produce the results for a "sponge-like" morphology in gold, silver, and aluminum confirm that the phenomena for this mode of coating growth is not unique to nickel alone. The conditions for these other metals fall within the zone boundaries for the "sponge-like" morphology as identified through the results for nickel but do not redefine the boundaries. The onset of the"sponge-like" morphology appears to occur intermediate to the transition Zone T and Zone 2, extending to higher temperatures as the working gas pressure increases. However, there is not sufficient data in this study to define the upper bound as affected by pressure at deposition temperatures in excess of ~$0.7T_{melt}$.

For physical vapor deposition processes, high deposition rates are generally considered as >10 nms$^{-1}$ whereas low deposition rates are <1 nms$^{-1}$. The deposition rate disclosed herein is not considered to be high and therefore is unlikely to be a significant factor to cause the "sponge-like" morphology.

Experimental

The effects of working gas pressure and substrate temperature are the key parameters in the assessment of growth modes for sputter deposited coatings. The deposition of the metallic coatings were conducted using 6.4 cm diameter planar magnetrons operated in the dc mode. The planar magnetrons were assembled with an unbalanced configuration of the iron-neodymium-boron magnets. The vacuum chamber was cryogenically pumped to a base pressure of 2 $\mu$Pa ($1.5 \times 10^{-8}$ Torr). A 25–40 cc min$^{-1}$ flow ($q_{gas}$) of the working gas was then initiated prior to substrate heating. The working gas is the boil off from a dewar of liquid Argon that is passed through a titanium sublimator yielding a gas purity greater than 0.99999. The gas pressure ($p_{gas}$) range is in multiples of 0.67 Pa (5 mTorr) to 4 Pa (30 mTorr). The substrates were silicon wafers with a 0.2–0.4 $\mu$m thick surface layer of silicon nitride. The substrates were mounted to the obverse side of a tantalum substrate platform. Thermocouples were attached to both the obverse and reverse sides of the substrate platform. The temperature variance across the substrate was less than 5 K (° C.). Once the selected conditions of gas pressure and flow were obtained, the substrate platform was heated from the reverse side using a resistive heater. A Variac™ supply was used to power the Boralectric™ (boron-nitride) resistive heater. The substrate temperature ($T_{sub}$) was experimentally found to be logarithmically proportional to the applied heater power ($P_{heat}$), that is, $T_{sub} \alpha \log(P_{heat})$. The substrate platform was insulated with a Macor™ spacer and was contained within a water-cooled copper shroud. This configuration facilitated substrate heating to elevated temperatures within the copper shroud while maintaining a temperature below 50° C. outside of the shroud. The planar magnetrons were situated 11 cm beneath the substrate surface. Typically, deposition rates up to 40 nm min$^{-1}$ were produced from applied forward powers of 8 W cm$^{-2}$ for coatings of nickel that were sputtered from a 0.9999 pure target.

The 1–10 $\mu$m thick coatings were examined in plan view and selectively in cross-section (after fracture) using a scanning electron microscope (SEM). The SEM images were formed from a combination of backscattered electrons and secondary electrons. An accelerating voltage of 5 kV for the beam (in comparison to typical values >20 kV) facilitated the topological imaging of the surface features.

SUMMARY

The stabilization of the "sponge-like" (S) morphology can be viewed within the context of the zone model for metal coatings as a new transition Zone S between Zones T and 2. The structure is characterized using SEM with continuity in three dimensions and with continuous porosity on the submicron scale. This structure is observed in metals as gold, silver, aluminum, and is presented in detail-for nickel across a range in temperatures that correspond with approximately 0.48–0.57 $T_{melt}$ and a low to intermediate (5–15 mTorr) range of working gas pressures.

Coatings, films or membranes with continuous porosity provide a significantly higher surface area to volume ratio in comparison to conventional dense surfaces. For applications where catalytic reactions are being utilized to convert one or more chemical compounds or biological materials to other forms, coatings, films or membranes having three dimensional high continuous porosity exhibit higher reactivity in comparison to otherwise, dense and planar surfaces of similar material. These coatings, films or membranes can be produced by combining vapor deposition processes with high-yield microelectronic processing methods. The need for traditional post-deposition process steps, e.g., gaseous or aqueous chemical etching are eliminated. Additionally, further control of compound reactions can be attained by depositing specific catalyst dopants into the metallic sponge.

The doping can be achieved by subsequent electrodeposition into the metallic sponge or through co-deposition during the synthesis of the vapor-deposited porous coating, film and/or membrane.

Membranes as porous metallic structures can be used in micro-filtration processes in which very small molecules need to be removed from a flowing gas or liquid stream. Specific control over the pore size and pore distribution is desired in order to capture specific molecules while allowing other molecular species to flow through the porous structure.

All numbers expressing quantities of ingredients, constituents, reaction conditions, and so forth used in the specification and claims are to be understood as being modified in all instances by the term "about". Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

The invention claimed is:

1. A sputter deposition method comprising:
   providing a substrate;
   sputter depositing a metal onto said substrate under temperatures ranging from 0.4 to 0.6 of the melting temperature of the metal to form a coating having a three dimensional sub-micron porosity.

* * * * *